(12) United States Patent
Wang et al.

(10) Patent No.: US 10,304,856 B2
(45) Date of Patent: May 28, 2019

(54) ARRAY SUBSTRATE AND METHODS OF MANUFACTURING SAME, AND DISPLAY PANEL AND DISPLAY APPARATUS INCLUDING THE ARRAY SUBSTRATE

(71) Applicant: BOE TECHNOLOGY GROUP CO., LTD., Beijing (CN)

(72) Inventors: Zuqiang Wang, Beijing (CN); Yuqing Yang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/529,963

(22) PCT Filed: Sep. 19, 2016

(86) PCT No.: PCT/CN2016/099324
§ 371 (c)(1),
(2) Date: May 25, 2017

(87) PCT Pub. No.: WO2017/128736
PCT Pub. Date: Aug. 3, 2017

(65) Prior Publication Data
US 2018/0076228 A1    Mar. 15, 2018

(30) Foreign Application Priority Data

Jan. 28, 2016    (CN) .......................... 2016 1 0058612

(51) Int. Cl.
| | |
|---|---|
| *H01L 27/12* | (2006.01) |
| *H01L 21/77* | (2017.01) |
| *H01L 23/31* | (2006.01) |
| *H01L 23/00* | (2006.01) |

(52) U.S. Cl.
CPC .......... *H01L 27/1218* (2013.01); *H01L 21/77* (2013.01); *H01L 23/31* (2013.01); *H01L 24/05* (2013.01); *H01L 24/29* (2013.01); *H01L 24/83* (2013.01); *H01L 27/12* (2013.01); *H01L 27/1262* (2013.01); *H01L 2224/04026* (2013.01); *H01L 2224/05006* (2013.01); *H01L 2924/36* (2013.01)

(58) Field of Classification Search
CPC ........... H01L 21/02354; H01L 23/3142; H01L 51/5246
See application file for complete search history.

(56) References Cited

U.S. PATENT DOCUMENTS

| | | | | |
|---|---|---|---|---|
| 6,011,301 A | * | 1/2000 | Chiu | ..................... H01L 21/563 257/678 |
| 7,964,943 B2 | | 6/2011 | Seo et al. | |

(Continued)

FOREIGN PATENT DOCUMENTS

| | | |
|---|---|---|
| CN | 1658387 A | 8/2005 |
| CN | 102255056 A | 11/2011 |

(Continued)

OTHER PUBLICATIONS

International Search Report and Written Opinion (including English translation) dated Dec. 26, 2017, for corresponding PCT Application No. PCT/CN2016/099324.

(Continued)

*Primary Examiner* — Robert T Huber
*Assistant Examiner* — Gardner W. S. Swan
(74) *Attorney, Agent, or Firm* — Kinney & Lange, P.A.

(57) ABSTRACT

Embodiments of the present invention provides an array substrate. The array substrate includes a display region and a packaging region. The packaging region includes a plurality of functional layers. And the packaging region further includes: a plurality of through holes running through at least one of the plurality of functional layers and configured to allow a packaging adhesive to enter therein; and a groove formed above at least some of the through holes, wherein, projection areas of the at least some of the through holes onto a base substrate of the array substrate are located within a projection area of the groove onto the base substrate. Embodiments of the present invention further provides a display panel and a display apparatus including the above- (Continued)

mentioned array substrate, and a method of manufacturing the abovementioned array substrate.

15 Claims, 7 Drawing Sheets

(56) References Cited

U.S. PATENT DOCUMENTS

| | | | |
|---|---|---|---|
| 2007/0176188 A1* | 8/2007 | Tanaka | H01L 33/46 257/88 |
| 2016/0088726 A1* | 3/2016 | Jeon | G02F 1/13452 361/749 |

FOREIGN PATENT DOCUMENTS

| | | |
|---|---|---|
| CN | 103367619 A | 10/2013 |
| CN | 104362167 A | 2/2015 |
| CN | 204333042 U | 5/2015 |
| CN | 105679770 A | 6/2016 |
| JP | 2009015122 A | 1/2009 |

OTHER PUBLICATIONS

First Chinese Office Action dated Mar. 5, 2018, for corresponding Chinese Application No. 201610058612.5.

* cited by examiner

ARRAY SUBSTRATE AND METHODS OF MANUFACTURING SAME, AND DISPLAY PANEL AND DISPLAY APPARATUS INCLUDING THE ARRAY SUBSTRATE

CROSS-REFERENCE TO RELATED APPLICATIONS

The present application claims the benefit of Chinese Patent Application No. 201610058612.5 and filed on Jan. 28, 2016, the entire disclosure of which is incorporated herein by reference.

BACKGROUND

1. Technical Field

Embodiments of the present invention relate to the field of display technology, and particularly to an array substrate in a display apparatus, a display panel and a display apparatus including the array substrate, and a method of manufacturing the array substrate.

2. Description of the Related Art

Packaging is required in the production process of a display apparatus, and advantages and disadvantages of the packaging have a greater impact on production yield.

SUMMARY

According to one aspect of embodiments of the present invention, there is provided an array substrate. The array substrate comprises a display region and a packaging region. The packaging region comprises a plurality of functional layers. And, the packaging region further comprises: a plurality of through holes running through at least one of the plurality of functional layers and configured to allow a packaging adhesive to enter therein; and a groove formed above at least some of the through holes, wherein, projection areas of the at least some of the through holes onto a base substrate of the array substrate are located within a projection area of the groove onto the base substrate.

In some embodiments of the present invention, a section of the through hole is set to have an inverted T-shaped structure.

In some embodiments of the present invention, the functional layers comprises a first film layer, a second film layer and a third film layer overlapped with one another, and the first film layer is further away from the base substrate than the second film layer and the third film layer; the through holes comprise a first through hole and a second through hole; the first through hole runs through the first film layer, the second film layer and the third film layer; the second through hole runs through the second film layer; and the groove comprises a first groove formed above the second through hole.

In some embodiments of the present invention, the through holes further comprise a third through hole; the third through hole runs through the second film layer and the third film layer; and the groove further comprises a second groove formed above the third through hole and/or a third groove formed above the second through hole and the third through hole.

In some embodiments of the present invention, the functional layers further comprise a fourth film layer; the through holes further comprise a fourth through hole; the fourth through hole runs through the second film layer, the third film layer and the fourth film layer; and the groove further comprises a fourth groove formed above the fourth through hole and/or a fifth groove formed above the second through hole and the fourth through hole.

In some embodiments of the present invention, the first film layer is a source-drain metal layer; the second film layer is a middle insulation layer; and the third film layer is a gate metal layer.

In some embodiments of the present invention, the first film layer is a source-drain metal layer; the second film layer is a middle insulation layer; the third film layer is a gate metal layer; and the fourth film layer is a gate insulation layer.

According to another aspect of some embodiments of the present invention, there is provided a display panel comprising: a packaging adhesive and the abovementioned array substrate, wherein the packaging adhesive is located within the packaging region of the array substrate.

According to yet another aspect of some embodiments of the present invention, there is provided a display apparatus comprising the abovementioned display panel.

According to still another aspect of some embodiments of the present invention, there is provided a method of manufacturing the abovementioned array substrate. The method comprises the following step of: forming a display region and a packaging region, the packaging region comprising a plurality of functional layers; wherein the step of forming the packaging region further comprises:

forming a plurality of through holes which run through at least one of the plurality of functional layers and are configured to allow a packaging adhesive to enter therein; and forming a groove above at least some of the through holes, wherein, projection areas of the at least some of the through holes onto a base substrate of the array substrate are located within a projection area of the groove onto the base substrate.

In some embodiments of the present invention, the abovementioned method further comprises a step of: setting a section of the through hole to have an inverted T-shaped structure.

In some embodiments of the present invention, the step of forming the packaging region further comprises: forming the functional layers comprising a first film layer, a second film layer and a third film layer, the first film layer being further away from the base substrate than the second film layer and the third film layer; forming a first groove in the first film layer by adopting a patterning process; and forming a first through hole and a second through hole by adopting a patterning process, wherein, the first through hole runs through the first film layer, the second film layer and the third film layer, the second through hole runs through the second film layer, and the first groove is located above the second through hole.

In some embodiments of the present invention, the step of forming the packaging region comprises: forming a third through hole by adopting a patterning process, wherein the third through hole runs through the second film layer and the third film layer; and forming a second groove and/or a third groove in the first film layer by adopting a patterning process, wherein, the second groove is located above the third through hole, and the third groove is located above the second through hole and the third through hole.

In some embodiments of the present invention, the step of forming the packaging region further comprises: forming a fourth film layer; forming a fourth through hole by adopting a patterning process, wherein the fourth through hole runs through the second film layer, the third film layer and the fourth film layer; and forming a fourth groove and/or a fifth groove in the first film layer by adopting a patterning process, wherein, the fourth groove is located above the fourth through hole, and the fifth groove is located above the second through hole and the fourth through hole.

BRIEF DESCRIPTION OF THE DRAWINGS

These and/or other aspects and advantages of the present disclosure will become apparent and more readily appreciated from the following description of the preferably embodiments, taken in conjunction with the accompanying drawings of which.

DETAILED DESCRIPTION OF THE EMBODIMENTS

Figure 1:
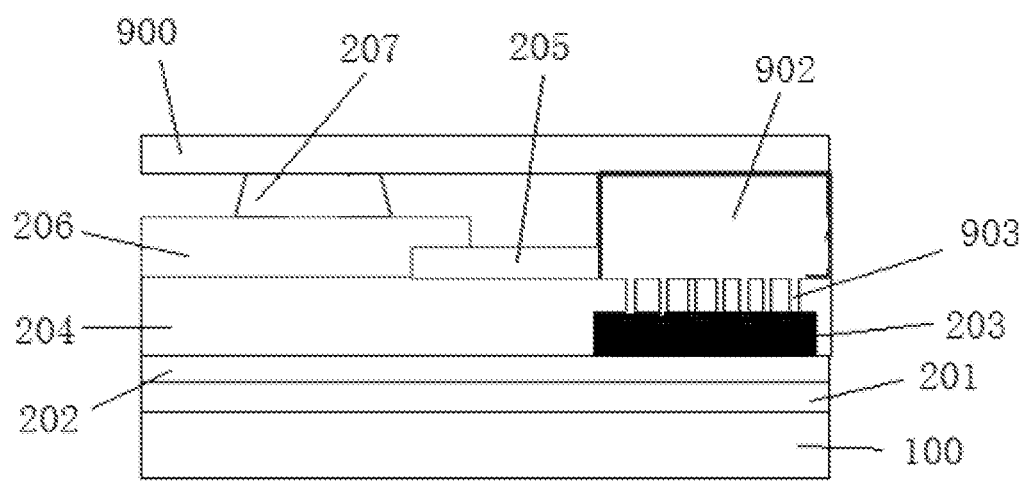
FIG. 1 is a schematic view of a package structure for an array substrate.

Embodiments of the present invention will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

FIG. 1 shows a packaging structure provided on an array substrate. The array substrate comprises a glass substrate 100, a buffer layer 201, a gate insulation layer 202, a gate metal layer 203, a middle insulation layer 204, a source-drain metal layer 205, an organic layer 206, spacers 207 and a glass cover 900. The packaging structure further comprises through holes 903 formed on some of functional layers of the array substrate and through which a packaging adhesive 902 flows to come into contact with gate metal.

Figure 2:
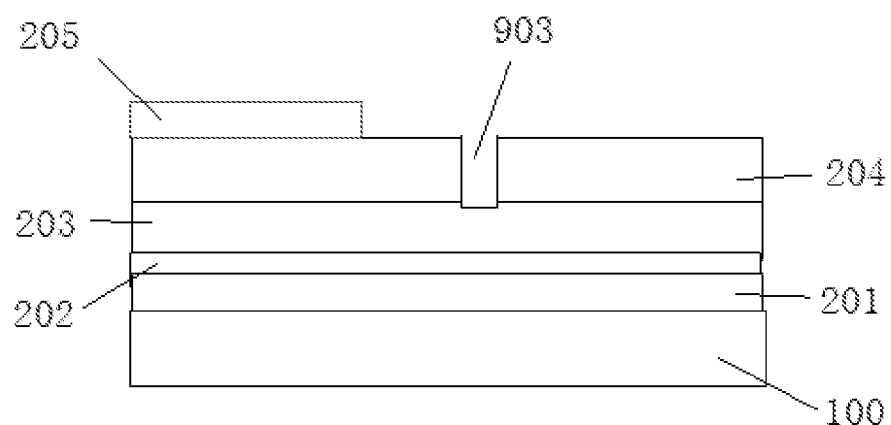
FIG. 2 is a partial view of the package structure shown in FIG. 1.

Referring to FIG. 2, which further shows structure of a through hole 903, the through hole 903 has a section of "I" shape.

It is found by the inventors that, when a packaging is performed adopting the packaging structure shown in FIGS. 1-2, it will have the following disadvantages.

During an assembling, packaging adhesive is melted by using a laser, and packaging structure of the above "I" shaped through hole causes overflow of the packaging adhesive.

The packaging structure of the above "I" shaped through hole leads to a greater residual stress inside the array substrate, which results in cracking of the packaging adhesive.

Mechanical strength of the packaging is not enough when the abovementioned packaging structure is adopted. Water vapor and oxygen gas are easy to enter into the array substrate when the final product is tested, which leads to failure of display device.

Figure 3:
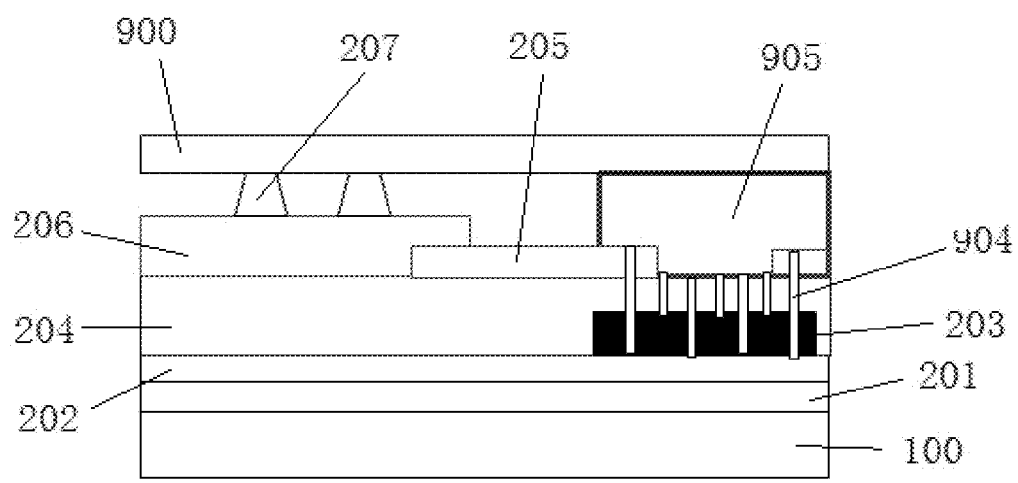
FIG. 3 is a schematic view of an embodiment of an array substrate according to the present disclosure.

FIG. 3 shows an embodiment of an array substrate according to the present disclosure. The array substrate comprises a display region and a packaging region. The packaging region comprises a plurality of functional layers. And, the packaging region comprises: a plurality of through holes 904 running through at least one functional layer and configured to allow a packaging adhesive to enter therein; and a groove 905 formed above at least some of the through holes 904, wherein, projection areas of the at least some of the through holes 904 onto a base substrate 100 of the array substrate are located within a projection area of the groove 905 onto the base substrate 100. With the array substrate provided by the present disclosure, the groove is provided to guide the adhesive while melting the packaging adhesive with a laser, which avoids overflow of the packaging adhesive caused by single through-hole structure adopted in conventional process. With the cooperation of the groove and the through holes, mechanical strength at a packaging location can be enhanced, residual stress inside the array substrate after packaging can be reduced, so that risk of cracking is reduced, and the array substrate according to the present disclosure is good in process compatibility and is simple and feasible.

In some embodiments of the present invention, the aforementioned functional layers comprises a first film layer, a second film layer and a third film layer overlapped with one another, and the first film layer is further away from the base substrate than the second film layer and the third film layer. The aforementioned through holes comprise a first through hole and a second through hole; the first through hole runs through the first film layer, the second film layer and the third film layer; the second through hole runs through the second film layer; and the aforementioned groove comprises a first groove formed above the second through hole.

In some embodiments of the present invention, the aforementioned through holes may further comprise a third through hole; the third through hole runs through the second film layer and the third film layer; and the aforementioned groove may further comprise a second groove (e.g. 9052 in FIG. 4a) formed above the third through hole 9043 and/or a third groove (e.g. 9053 in FIG. 4) formed above the second through hole 9042 and the third through hole 9043.

Specifically, in the embodiment of the array substrate shown in FIG. 3, the array substrate comprises a plurality of functional layers, including a base substrate 100 (for example, it may be a glass substrate), a buffer layer 201, a gate insulation layer 202, a gate metal layer 203, a middle insulation layer 204, a source-drain metal layer 205, an organic layer 206, spacers 207 and a glass cover 900 and the like. Here, the abovementioned first film layer is the source-drain metal layer 205; the abovementioned second film layer is the middle insulation layer 204; and the abovementioned third film layer is the gate metal layer 203. However, particular forms of the abovementioned first film layer and the second film layer and the third film layer are not limited in the present disclosure. In this embodiment, for explanation purpose, the source-drain metal layer 205, the middle insulation layer 204 and the gate metal layer 203 overlapped with one another are taken as an example, however, positional relationship among the first film layer, the second film layer and the third film layer is not limited in the present disclosure. For example, the first film layer is the source-drain metal layer 205, the second film layer is the gate metal layer 203, and the third film layer is the middle insulation layer 204, etc., correspondingly, the first groove is formed by implementing a patterning process on the source-drain metal layer 205 and the middle insulation layer 204. In addition, the first film layer, the second film layer and the third film layer may also be other functional layers of the array substrate, including a passivation layer, a semiconductor layer, an organic electroluminescence layer, and the like.

In an embodiment of the present invention, a third groove 905 located above the second through hole (for example, corresponding to through hole 9042 in FIG. 4) and the third through hole (for example, corresponding to through hole 9043 in FIG. 4), in FIG. 3, is taken as an example. The groove, for example the third groove 905, is provided, and, projection areas of the second through hole and the third through hole onto the base substrate 100 are located within a projection area of the groove 905 onto the base substrate 100, that is to say, an area of the projection area of the groove 905 onto the base substrate 100 is equal to or is greater than an area of the projection areas of the second through hole and third through hole onto the base substrate 100. As a result, while the packaging adhesive is melted with a laser, the groove 905 can function to guide the adhesive, so as to avoid overflow of the packaging adhesive, which solves the problem of overflow of the packaging adhesive existing in prior art. Meanwhile, these through holes run through different film layers, that is, these through holes are in different depths, accordingly, internal stress may be balanced, so that residual stress after performing the melting with the laser is reduced, and thus risk of cracking is reduced.

In some embodiments of the present invention, the grooves, for example the first groove and the second groove, may be also provided independently above the second through hole and the third through hole, respectively.

Figure 4:
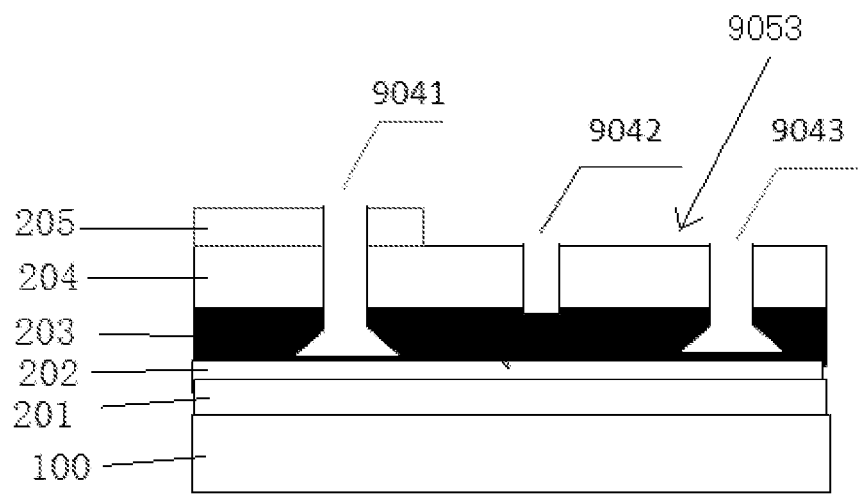
FIG. 4 is a schematic view of another embodiment of the array substrate according to the present disclosure.
Figure 4A:
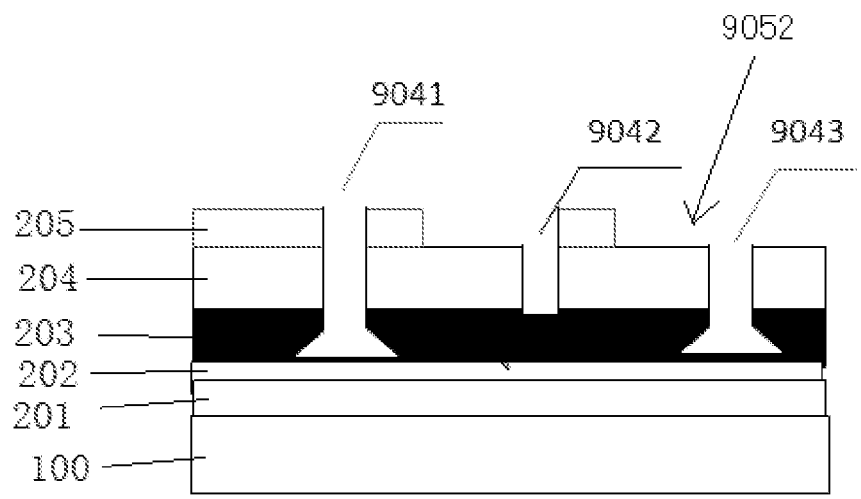
FIG. 4a is a schematic view of another embodiment of the array substrate according to the present disclosure.

FIG. 4 shows another embodiment of the array substrate according to the present disclosure.

For easy explanation, FIG. 4 merely shows some functional layers, related to the through holes, in the array substrate. For clarity purposes, in FIG. 4, first through hole, second through hole and third through hole are denoted by reference numbers 9041, 9042 and 9043, respectively. For clarity purposes, FIG. 4 illustrates only some functional layers of the array substrate, including a glass substrate 100, a buffer layer 201, a gate insulation layer 202, a gate metal layer 203, a middle insulation layer 204 and a source-drain metal layer 205. Different from the embodiment shown in FIG. 3, in FIG. 4, sections of the first through hole 9041 and the third through hole 9043 are set to have an inverted T-shaped structure. With the above inverted T-shaped structure of these through holes, much more packaging adhesive can be accommodated within the through holes, in this way, mechanical strength at a packaging location is enhanced. It should be noted that, any one of the first, second and third through holes may be in an inverted T-shaped structure, however, in view of technological difficulty, it is preferably that sections of the first through hole 9041 and the third through hole 9043 may be set to have an inverted T-shaped structure.

Figure 5:
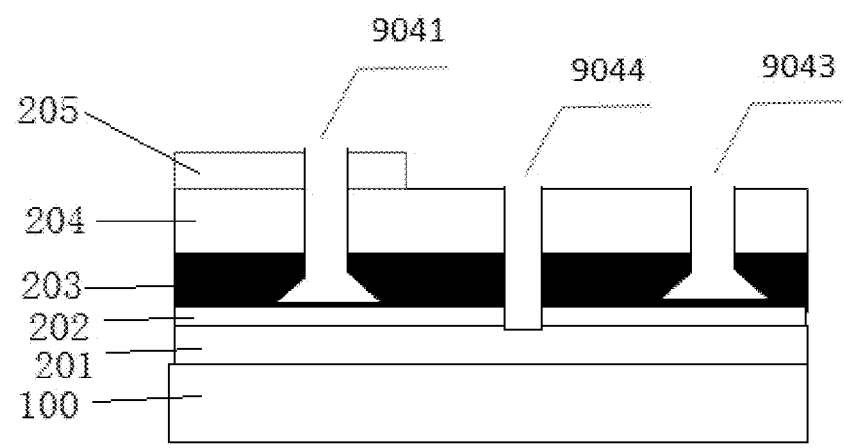
FIG. 5 is a schematic view of yet another embodiment of the array substrate according to the present disclosure.

For example, FIG. 5 also shows through holes having inverted T-shaped sections.

Referring to FIGS. 3-5, in some embodiments of the present invention, the through holes may comprise the ones being in different depths. Specifically, in the embodiment shown in FIG. 4, the functional layers of the array substrate comprise a source-drain metal layer 205 (the first film layer), a middle insulation layer 204 (the second film layer) and a gate metal layer 203 (the third film layer) provided in sequence from top to bottom. The plurality of through holes comprise: a first through hole 9041 running from the source-drain metal layer 205 to the gate metal layer 203 through the middle insulation layer 204, a second through hole 9042 running through the middle insulation layer 204, and a third through hole 9043 running from the middle insulation layer 204 to the gate metal layer 203. With these through holes of different depths, residual stress inside the array substrate after packaging can be reduced, and thus risk of cracking is reduced.

In some embodiments of the present invention, the functional layers may further comprise a fourth film layer; the through holes further comprise a fourth through hole; the fourth through hole runs through the second film layer, the third film layer and the fourth film layer; and the groove may further comprises a fourth groove formed above the fourth through hole and/or a fifth groove formed above the third through hole and the fourth through hole.

Figure 5A:
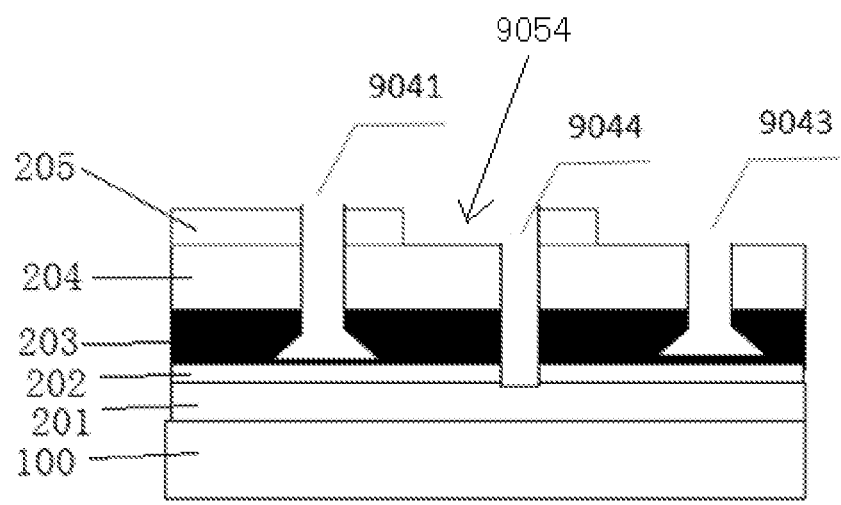
FIG. 5a is a schematic view of still yet another embodiment of the array substrate according to the present disclosure.
Figure 5A:
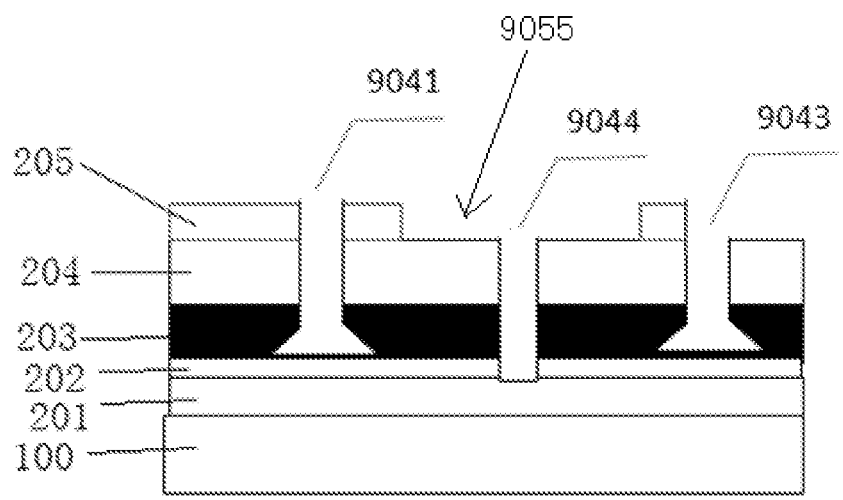

Specifically, referring to FIG. 5, the functional layers of the array substrate comprise a source-drain metal layer 205, a middle insulation layer 204, a gate metal layer 203 and a gate insulation layer 202 (the fourth film layer) provided in sequence from top to bottom. The plurality of through holes comprise: a first through hole 9041 running from the source-drain metal layer 205 to the gate metal layer 203 through the middle insulation layer 204, a fourth through hole 9044 running from the middle insulation layer 204 to the gate insulation layer 202 through the gate metal layer 203, and a third through hole 9043 running from the middle insulation layer 204 to the gate metal layer 203. The groove may comprise a fourth groove (e.g. 9054 in FIG. 5) formed above the fourth through hole 9044, or a fifth groove (e.g. 9055 in FIG. 5a) formed above both the third through hole 9043 and the fourth through hole 9044.

Although the above description illustrates different embodiments of the array substrate according to the present disclosure, the above embodiments are not used to limit the present invention, and these embodiments may be combined with one another or may be presented independently from one another. In one example, those skilled in the art may achieve an array substrate in which the groove(s) and the through hole(s) are included. In another example, those skilled in the art may achieve an array substrate in which the grooves and the through holes having different lengths are included.

The present disclosure further provides a display panel comprising a packaging adhesive and the abovementioned array substrate, wherein the packaging adhesive is located within the packaging region of the array substrate.

The present disclosure still further provides a display apparatus comprising the abovementioned display panel.

In addition, the present disclosure yet further provides a method of manufacturing the abovementioned array substrate. The method comprises the following step of: forming a display region and a packaging region, the packaging region comprising a plurality of functional layers; wherein, the aforementioned step of forming the packaging region comprises: forming a plurality of through holes which run through at least one functional layer and is configured to allow a packaging adhesive to enter therein; and, forming a groove above at least some of the through holes, wherein, projection areas of the at least some of the through holes onto a base substrate of the array substrate are located within a projection area of the groove onto the base substrate. In a specific embodiment, the abovementioned method may further comprise the following step of: setting a section of the through hole to have an inverted T-shaped structure. In the step of forming the plurality of through holes, these through holes may be formed in different lengths. With the manufacturing method of present disclosure, no additional mask process needs to be added, and manufacture of the above array substrate can be completed by just changing pattern form of an existing mask. The method is good in process compatibility, and is simple and feasible.

In an embodiment of the present invention, the step of forming the packaging region further comprises, forming the functional layers comprising a first film layer, a second film layer and a third film layer, the first film layer being further away from the base substrate than the second film layer and the third film layer; forming a first groove in the first film layer by adopting a patterning process; and forming a first through hole and a second through hole by adopting a patterning process, wherein, the first through hole runs through the first film layer, the second film layer and the third film layer, the second through hole runs through the second film layer, and the first groove is located above the second through hole.

In some embodiments of the present invention, the first film layer is a source-drain metal layer, the second film layer is a middle insulation layer, and the third film layer is a gate metal layer. Firstly of all, the gate metal layer is deposited, and a patterning process is performed on the gate metal layer. After performing exposure and development with a mask, a dry etching is performed, to form a gate pattern in the display region and to form a gate metal layer pattern in the packaging region. Then, a photoresist coating is provided to protect effective display area. After that, inverted T-shaped through holes are formed in the following steps. The gate metal layer in the packaging region is processed using a wet etching method, inverted T-shaped through holes running through the gate metal layer are formed at the bottom of the gate metal layer, next, the middle insulation layer and the source-drain metal layer are deposited and, by etching, via holes are formed in the corresponding positions, and, some of the via holes, connected with the inverted T-shaped through holes formed in the gate metal layer, constitute complete through holes, for example, first through hole and third through hole.

In some embodiments of the present invention, the groove may be formed in the first film layer. After the groove is formed by etching, a through hole located below the groove is formed within a region where the groove is in. As shown in FIG. 3, after the third groove 905 is formed in the source-drain metal layer by a patterning process, the middle insulation layer 204 is exposed. Then, by etching, the second through hole and the third through hole located within a region where the third groove 905 is in are formed; or else, the second through hole and the third through hole are firstly formed, and then, the first film layer (the source-drain metal layer) is deposited, the third groove is formed, by etching, at the position corresponding to the second through hole and the third through hole, and source-drain metal material left in the second through hole and the third through hole are removed by etching. It should be noted that, formations of the through holes and the groove are not limited to these mentioned herein, and those skilled in the art may adopt any feasible formation solutions according to requirements. For example, the through holes may be formed on these functional layers respectively and independently, and then these functional layers are assembled in position; or else, the through holes may also be formed using one patterning process, while suitable choices may be done according to thicknesses of these functional layers.

In some embodiments of the present invention, the step of forming the packaging region further comprises: forming a fourth film layer; forming a fourth through hole by adopting a patterning process, wherein the fourth through hole runs through the second film layer, the third film layer and the fourth film layer; and forming a fourth groove and/or a fifth groove in the first film layer by a patterning process, wherein, the fourth groove is located above the fourth through hole, and the fifth groove is located above the second through hole and the fourth through hole. Specific formation methods are similar to the above methods of forming the through holes and the groove, and thus will not be described here.

Furthermore, a process of packaging the array substrate according to the present disclosure will be described hereinafter.

Figure 6:
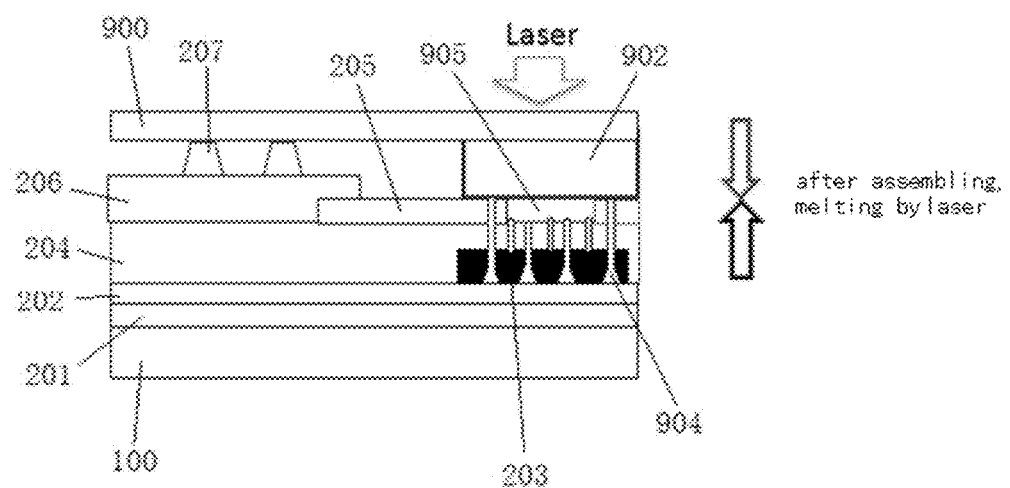
FIG. 6 is a schematic view of performing packaging and melting processing on the array substrate according to the present disclosure.

Referring to FIG. 6, after assembling, a region coated with packaging adhesive is irradiated using a laser, the packaging adhesive 902 is melted, and the melted packaging adhesive 902 flows into the through holes 904 through the groove 905, and finally, the packaging is completed.

Although several embodiments of the present disclosure have been shown and described, it would be appreciated by those skilled in the art that various changes may be made in these embodiments without departing from the principles and spirit of the disclosure, the scope of which is defined in the claims and their equivalents.

What is claimed is:

1. An array substrate comprising a packaging region for a packaging function, the packaging region comprising a plurality of functional layers and further comprising:
   a plurality of through holes running through at least one of the plurality of functional layers and configured to allow a packaging adhesive to enter therein; and
   a groove formed above at least some of the through holes, wherein, projection areas of the at least some of the through holes onto a base substrate of the array substrate are located within a projection area of the groove onto the base substrate;
   wherein:
   the functional layers comprises a first film layer, a second film layer and a third film layer overlapped with one another, and the first film layer is further away from the base substrate than the second film layer and the third film layer;
   the through holes comprise a first through hole and a second through hole;
   the first through hole runs through the first film layer, the second film layer and the third film layer;
   the second through hole runs through the second film layer;
   the groove comprises a first groove formed above the second through hole; and
   the first film layer is a source-drain metal layer; the second film layer is a middle insulation layer; and the third film layer is a gate metal layer.

2. The array substrate of claim 1, wherein,
   a section of the through hole is set to have an inverted T-shaped structure.

3. The array substrate of claim 1, wherein,
the through holes further comprise a third through hole;
the third through hole runs through the second film layer and the third film layer; and
the groove further comprises a second groove formed above the third through hole and/or a third groove formed above the second through hole and the third through hole.

4. The array substrate of claim 1, wherein,
the functional layers further comprise a fourth film layer;
the through holes further comprise a fourth through hole;
the fourth through hole runs through the second film layer, the third film layer and the fourth film layer; and
the groove further comprises a fourth groove formed above the fourth through hole and/or a fifth groove formed above the third through hole and the fourth through hole.

5. The array substrate of claim 4, wherein,
the fourth film layer is a gate insulation layer.

6. A display panel comprising: the packaging adhesive, and the array substrate of claim 1, wherein the packaging adhesive is located within the packaging region of the array substrate.

7. The display panel of claim 6, wherein, in the array substrate, a section of the through hole is set to have an inverted T-shaped structure.

8. The display panel of claim 6, wherein, in the array substrate, the through holes further comprise a third through hole;
the third through hole runs through the second film layer and the third film layer; and
the groove further comprises a second groove formed above the third through hole and/or a third groove formed above the second through hole and the third through hole.

9. The display panel of claim 6, wherein, in the array substrate, the functional layers further comprise a fourth film layer;
the through holes further comprise a fourth through hole;
the fourth through hole runs through the second film layer, the third film layer and the fourth film layer; and
the groove further comprises a fourth groove formed above the fourth through hole and/or a fifth groove formed above the third through hole and the fourth through hole.

10. The display panel of claim 9, wherein,
the fourth film layer is a gate insulation layer.

11. A display apparatus comprising the display panel of claim 6.

12. A method of manufacturing the array substrate of claim 1, the method comprising the following step of:
forming the packaging region, the packaging region comprising the plurality of functional layers; wherein the step of forming the packaging region comprises:
forming the plurality of through holes which run through at least one of the plurality of functional layers and are configured to allow the packaging adhesive to enter therein; and
forming the groove above at least some of the through holes, wherein, projection areas of the at least some of the through holes onto the base substrate of the array substrate are located within the projection area of the groove onto the base substrate;
wherein the step of forming the packaging region further comprises:
forming the functional layers comprising the first film layer, the second film layer and the third film layer, the first film layer being further away from the base substrate than the second film layer and the third film layer;
forming the first groove in the first film layer by adopting a first patterning process; and
forming the first through hole and the second through hole by adopting a second patterning process, wherein, the first through hole runs through the first film layer, the second film layer and the third film layer, the second through hole runs through the second film layer, and the first groove is located above the second through hole;
wherein the first film layer is a source-drain metal layer; the second film layer is a middle insulation layer; and the third film layer is a gate metal layer.

13. The method of claim 12, further comprising a step of:
setting a section of the through hole to have an inverted T-shaped structure.

14. The method of claim 12, wherein the step of forming the packaging region further comprises:
forming a third through hole by adopting the second patterning process, wherein the third through hole runs through the second film layer and the third film layer; and
forming a second groove and/or a third groove in the first film layer by adopting the first patterning process, wherein, the second groove is located above the third through hole, and the third groove is located above the second through hole and the third through hole.

15. The method of claim 12, wherein the step of forming the packaging region further comprises:
forming a fourth film layer;
forming a fourth through hole by adopting the second patterning process, wherein the fourth through hole runs through the second film layer, the third film layer and the fourth film layer; and
forming a fourth groove and/or a fifth groove in the first film layer by adopting the first patterning process, wherein, the fourth groove is located above the fourth through hole, and the fifth groove is located above the second through hole and the fourth through hole.

* * * * *